(12) United States Patent
Hayakawa (10) Patent No.: US 8,401,495 B2
(45) Date of Patent: Mar. 19, 2013

(54) HIGH-FREQUENCY MODULE AND COMMUNICATION APPARATUS USING THE MODULE

(75) Inventor: Masashi Hayakawa, Nagaokakyo (JP)

(73) Assignee: Murata Manufacturing Co., Ltd. (JP)

( * ) Notice: Subject to any disclaimer, the term of this patent is extended or adjusted under 35 U.S.C. 154(b) by 652 days.

(21) Appl. No.: 12/356,731

(22) Filed: Jan. 21, 2009

(65) Prior Publication Data

US 2009/0185512 A1    Jul. 23, 2009

Related U.S. Application Data

(63) Continuation of application No. PCT/JP2007/064497, filed on Jul. 24, 2007.

(30) Foreign Application Priority Data

Jul. 25, 2006    (JP) .................................. 2006-202337

(51) Int. Cl.
*H04B 1/44*    (2006.01)

(52) U.S. Cl. ................ 455/78; 455/73; 455/80; 455/82; 455/552.1; 455/553.1

(58) Field of Classification Search ............ 455/78, 455/80, 552.1, 403, 428, 83, 550.1, 435.2, 455/453.1, 553.1, 73, 79, 82, 84; 333/100, 333/101, 133, 103, 185, 193, 194, 195, 196; 370/297, 132, 133, 104
See application file for complete search history.

(56) References Cited

U.S. PATENT DOCUMENTS

| | | | | |
|---|---|---|---|---|
| 6,442,376 B1 * | 8/2002 | Furutani et al. | ................. | 455/82 |
| 6,766,149 B1 * | 7/2004 | Hikita et al. | .................... | 455/83 |
| 6,788,958 B2 * | 9/2004 | Furutani et al. | ............ | 455/552.1 |
| 7,200,365 B2 * | 4/2007 | Watanabe et al. | ................ | 455/82 |
| 7,356,349 B2 * | 4/2008 | Furutani et al. | ............ | 455/552.1 |
| 7,398,103 B2 * | 7/2008 | Furutani et al. | ............ | 455/552.1 |
| 7,711,389 B2 * | 5/2010 | Furutani et al. | ............ | 455/552.1 |

(Continued)

FOREIGN PATENT DOCUMENTS

| JP | 2000-165274 A | 6/2000 |
|---|---|---|
| JP | 2002-101005 A | 4/2002 |

(Continued)

OTHER PUBLICATIONS

Minoru Yamanaka; "International Search Report"; PCT/JP2007/064497; Sep. 4, 2007.

(Continued)

*Primary Examiner* — Lewis West
*Assistant Examiner* — Md Talukder
(74) *Attorney, Agent, or Firm* — Studebaker & Brackett PC; Tim L. Brackett, Jr.; John F. Guay (57) ABSTRACT

A high-frequency module has a configuration in which a diplexer is capable of separating the frequency bands of first and second communication systems from the frequency band of a third communication system, a first high-frequency switch is capable of separating a transmission signal of the first or second communication system from a reception signal thereof, a second high-frequency switch is capable of separating a transmission signal of the third communication system from a reception signal thereof, and a third high-frequency switch is capable of separating the reception signal of the first communication system from the reception signal of the second communication system. A reception-signal output port for the second communication system of the high-frequency module is terminated with a chip capacitor to configure the double-band high-frequency module supporting the first and third communication systems.

9 Claims, 8 Drawing Sheets

U.S. PATENT DOCUMENTS

| | | | |
|---|---|---|---|
| 7,904,030 B2* | 3/2011 | Uriu et al. | 455/83 |
| 2002/0127973 A1* | 9/2002 | Furutani et al. | 455/82 |
| 2003/0199271 A1* | 10/2003 | Watanabe et al. | 455/424 |
| 2004/0242189 A1* | 12/2004 | Furutani et al. | 455/403 |
| 2004/0266378 A1* | 12/2004 | Fukamachi et al. | 455/188.1 |
| 2005/0134402 A1* | 6/2005 | Uriu et al. | 333/133 |
| 2006/0245382 A1* | 11/2006 | Hayashi | 370/297 |
| 2008/0218927 A1* | 9/2008 | Harada et al. | 361/119 |
| 2009/0268647 A1* | 10/2009 | Uejima | 370/297 |
| 2010/0301964 A1* | 12/2010 | Uejima | 333/101 |

FOREIGN PATENT DOCUMENTS

| | | |
|---|---|---|
| JP | 2003-152590 A | 5/2003 |
| JP | 2003-273687 A | 9/2003 |
| JP | 2006-108734 A | 4/2006 |
| JP | 2006-129433 A | 5/2006 |

OTHER PUBLICATIONS

Minoru Yamanak; "Written Opinion of the International Searching Authority" PCT/JP2007/064497; Sep. 4, 2007.

* cited by examiner

HIGH-FREQUENCY MODULE AND COMMUNICATION APPARATUS USING THE MODULE

CROSS REFERENCE TO RELATED APPLICATIONS

The present application is a continuation of International Application No. PCT/JP2007/064497, filed Jul. 24, 2007, which claims priority to Japanese Patent Application No. JP2006-202337, filed Jul. 25, 2006, the entire contents of each of these applications being incorporated herein by reference in their entirety.

BACKGROUND OF THE INVENTION

1. Field of the Invention

The present invention relates to a high-frequency module that receives and outputs multiple high-frequency signals within different frequency bands and to a communication apparatus using the module.

2. Description of Related Art

Various mobile communication systems for multiple frequency bands, such as Digital Cellular System (DCS) using a 1.8-GHz frequency band, Personal Communication Services (PCS) using a 1.9-GHz frequency band, and Global System for Mobilecommunications (GSM) using a 900-MHz frequency band, are currently used. Mobile terminals supporting these multiple mobile communication systems, for example, double-band devices and triple-band devices have been developed. Such mobile terminals are required to include high-frequency modules including switch circuits for switching the systems to be used. Such a triple-band mobile phone is disclosed in, for example, Japanese Unexamined Patent Application Publication No. 2002-43977.

Figure 1:
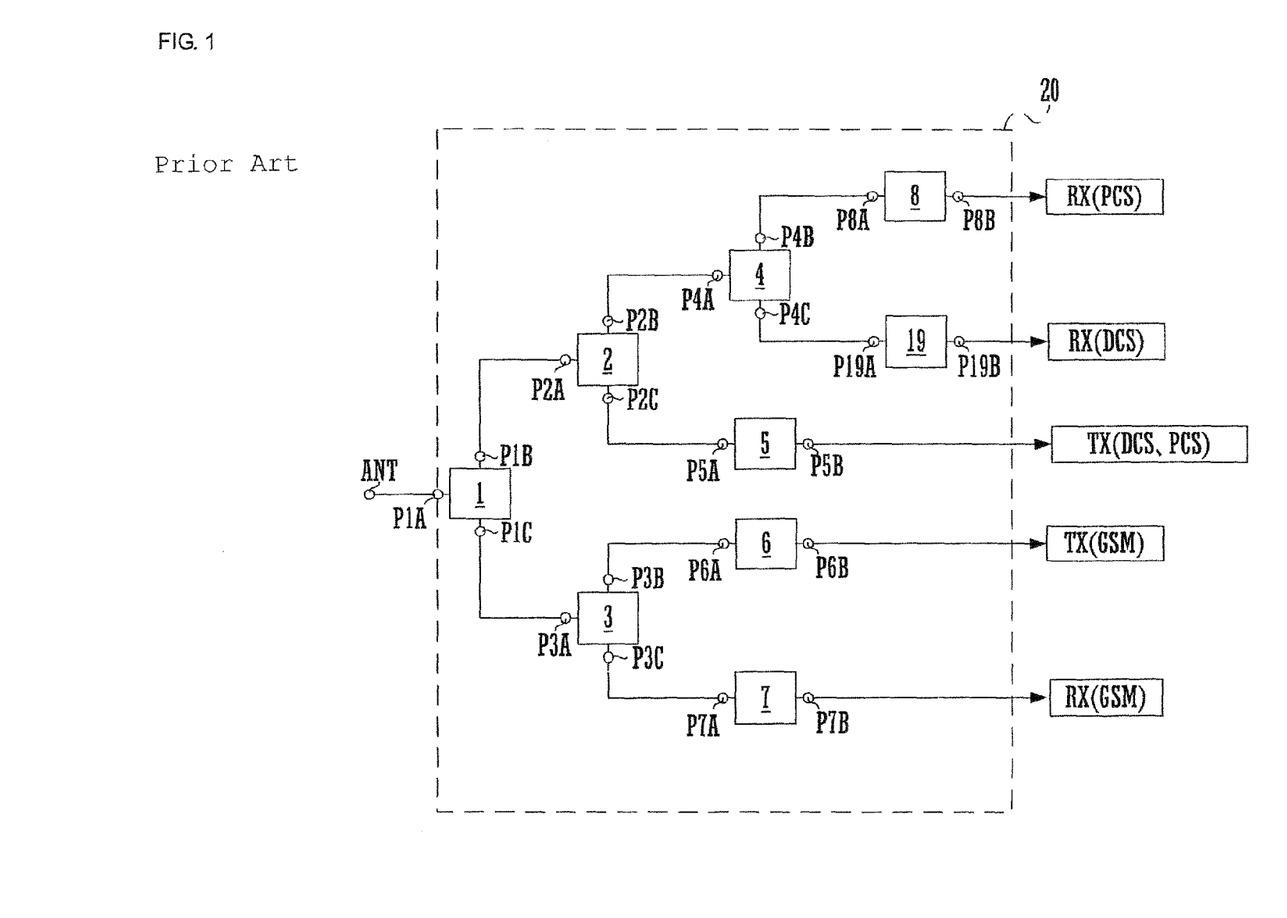
FIG. 1 is a diagram showing the configuration of a high-frequency module in related art.

FIG. 1 is a block diagram showing a triple-band high-frequency circuit for a mobile phone in related art. An example in which the 1.8-GHz DCS, the 1.9-GHz PCS, and the 900-MHz GSM are adopted as communication systems having different frequencies is shown in FIG. 1.

The triple-band high-frequency circuit for a mobile phone includes a high-frequency module 20, a transmission circuit TX (DCS, PCS) for both the DCS and the PCS, a reception circuit RX (DCS) for the DCS, a reception circuit RX (PCS) for the PCS, a transmission circuit TX (GSM) for the GSM, and a reception circuit RX (GSM) for the GSM. The high-frequency module 20 includes a diplexer 1, a high-frequency switch 2, a high-frequency switch 3, a high-frequency switch 4, LC filters 5 and 6, a surface acoustic wave (SAW) filter 7, a SAW filter 8, and a SAW filter 19.

The diplexer 1 has a function of outputting a DCS, PCS, or GSM transmission signal to an antenna ANT in the transmission and allocating a reception signal from the antenna ANT to a circuit corresponding to the DCS, the PCS, or the GSM in the reception. The antenna ANT is connected to a first port P1A of the diplexer 1, a first port P2A of the high-frequency switch 2 is connected to a second port P1B thereof, and a first port P3A of the high-frequency switch 3 is connected to a third port P1C thereof.

The high-frequency switch 2 switches between the side of the transmission circuit TX (DCS and PCS) for both the DCS and the PCS and the side of the reception circuit RX (DCS) for the DCS and the reception circuit RX (PCS) for the PCS. A first port P4A of the high-frequency switch 4 is connected to a second port P2B of the high-frequency switch 2 and a first port P5A of the LC filter 5 is connected to a third port P2C thereof.

The high-frequency switch 4 switches between the side of the reception circuit RX (DCS) for the DCS and the side of the reception circuit RX (PCS) for the PCS. A first port P8A of the SAW filter 8 is connected to a second port P4B of the high-frequency switch 4 and a first port P19A of the SAW filter 19 is connected to a third port P4C thereof.

The SAW filter 8 allows a PCS reception signal to pass through and attenuates an undesired wave other than the reception signal. The reception circuit RX (PCS) is connected to a second port P8B of the SAW filter 8.

The SAW filter 19 allows a DCS reception signal to pass through and attenuates an undesired wave other than the reception signal. The reception circuit RX (DCS) is connected to a second port P19B of the SAW filter 19.

The LC filter 5 allows DCS and PCS transmission signals to pass through and attenuates an undesired wave other than the transmission signals. The transmission circuit TX (DCS, PCS) for the DCS and the PCS is connected to a second port P5B of the LC filter 5.

The high-frequency switch 3 switches between the side of the transmission circuit TX (GSM) for the GSM and the side of the reception circuit RX (GSM) for the GSM. A first port P6A of the LC filter 6 is connected to a second port P3B of the high-frequency switch 3 and a first port P7A of the SAW filter 7 is connected to a third port P3C thereof.

The LC filter 6 allows a GSM transmission signal to pass through and attenuates an undesired wave other than the transmission signal. The transmission circuit TX (GSM) for the GSM is connected to a second port P6B of the LC filter 6.

The SAW filter 7 allows a GSM reception signal to pass through and attenuates an undesired wave other than the reception signal. The reception circuit RX (GSM) for the GSM is connected to a second port P7B of the SAW filter 7.

In such a triple-band high-frequency module, the characteristics of the elements are designed (adjusted) so as to achieve impedance matching between the transmission circuit and the reception circuit of each communication system.

In addition, in response to demands from markets, various double-band high-frequency modules each including one diplexer and two high-frequency switches are also provided, in addition to the triple-band high-frequency modules.

The double-band high-frequency modules differ from the triple-band high-frequency modules in the elements that are required and also in the mounting-electrode patterns of mounting boards on which the elements are mounted. Accordingly, when the double-band high-frequency modules and the triple-band high-frequency modules are manufactured, separate manufacturing lines corresponding to the respective high-frequency modules are required. As a result, it is not possible to use common processes and/or mounting boards between the double-band high-frequency modules and the triple-band high-frequency modules. This causes the manufacturing costs of the double-band high-frequency modules and the triple-band high-frequency modules to be increased.

For example, the switching of the switches can be controlled, such that the ports for one communication system are not used for the triple-band high-frequency modules, so as to provide the double-band support. However, even in such a case, many unnecessary parts that were intended for triple-band high-frequency modules are mounted in the double-band high-frequency modules and the double-band high-frequency modules become expensive.

In addition, when the parts of the ports for one communication system are not mounted, such as when SAW filters are not mounted in triple-band high-frequency modules to provide double-band high-frequency modules, high-frequency modules can be manufactured at costs lower than those of the triple-band high-frequency modules. However, it becomes very difficult to achieve band characteristics (for example, attenuation characteristics) necessary for the remaining two communication systems.

SUMMARY OF THE INVENTION

To overcome the problems described above, preferred embodiments of the present invention provide a double-band high-frequency module by using a mounting board common to a triple-band high-frequency module and provide a communication apparatus including the double-band high-frequency module.

According to an embodiment of the present invention, a high-frequency module of the present invention includes a diplexer that is provided with an antenna port to be connected to an antenna and that separates the frequency bands of first and second communication systems from the frequency band of a third communication system, a first high-frequency switch that separates a transmission signal of the first or second communication system from a reception signal thereof, a second high-frequency switch that separates a transmission signal of the third communication system from a reception signal thereof, and a third high-frequency switch that separates the reception signal of the first communication system from the reception signal of the second communication system. The high-frequency module is characterized in that one of reception-signal output ports that outputs the respective reception signals of the first to third communication systems is terminated with a chip capacitor.

In the above-mentioned embodiment, since the chip capacitor is connected to one of the ports (the reception-signal output ports) outputting the reception signals of the first to third communication systems, the impedance of the chip capacitor can be appropriately set to facilitate the impedance matching in the corresponding part, thus achieving desired band characteristics. Accordingly, it is possible to configure the double-band high-frequency module by using a mounting board common to that of a triple-band high-frequency module, and by connecting (i.e., mounting) not a filter module but a chip capacitor to or in one of three reception-signal output ports.

Since the chip capacitor is generally inexpensive, compared with the filter module (e.g., such as a SAW filter) mounted in the triple-band high-frequency module, the manufacturing cost (e.g., the costs of parts) of the double-band high-frequency module can be reduced. The double-band high-frequency module differs from the triple-band high-frequency module in that the triple-band high-frequency module uses the filter (i.e., filter module), while the double-band high-frequency module uses the chip capacitor. Consequently, the mounting board and the manufacturing process common to those of the triple-band high-frequency module can be used in the double-band high-frequency module, thus reducing the manufacturing cost of the double-band high-frequency module.

According to an embodiment of the present invention, the third high-frequency switch of the present invention includes a circuit connected to the reception-signal output port for the first communication system, the third high-frequency switch includes a switch control terminal, and a circuit connected to the reception-signal output port for the second communication system, wherein the circuit connected to the reception-signal output port for the second communication system includes a connection electrode for the chip capacitor.

In this embodiment, the high-frequency module in which the reception-signal output port for the second communication system is terminated with the chip capacitor can be configured, so that the double-band high-frequency module using the first communication system and the third communication system can be configured.

According to an embodiment of the present invention, the third high-frequency switch of the present invention includes a diode and a line that are connected to the connection electrode of the chip capacitor and a capacitor and a resistor that are connected to the diode in the circuit connected to the reception-signal output port for the second communication system. The circuit connected to the reception-signal output port for the second communication system is connected to the circuit connected to the reception-signal output port for the first communication system via the line.

In the case of a general double-band high-frequency module, only the circuits connected to the reception-signal output ports for two (for example, the first and third) communication systems are provided. In contrast, in the configuration of the high-frequency module of the present invention, the circuits connected to the reception-signal output ports for the three communication systems are provided, and the circuit connected to the reception-signal output port for the communication system that is not used includes the diode and the line that are connected to the connection electrode of the chip capacitor and the capacitor and the resistor that are connected to the diode. Accordingly, it is possible to configure the double-band high-frequency module of the present invention only by providing the chip capacitor in the circuit connected to the reception-signal output port for the second communication system on the mounting board of a conventional triple-band high-frequency module.

According to an embodiment of the present invention, in the high-frequency module of the present invention, the diplexer and the first to third high-frequency switches are integrated with one another on a layered body formed by layering a plurality of dielectric layers.

In this embodiment, the high-frequency module of the present invention can be configured in a small size.

According to an embodiment of the present invention, the connection electrode of the chip capacitor has a shape allowing a filter to be mounted instead of the chip capacitor.

In this embodiment, it is possible to easily share the mounting board and the mounting process between the double-band high-frequency module and the triple-band high-frequency module.

According to an embodiment of the present invention, the filter is a surface acoustic wave filter. With this configuration, the high-frequency module can be reduced in size.

When the side of the reception-signal output port for the second communication system of the third high-frequency switch is viewed from the first high-frequency switch, the impedance in a state in which the capacitor is mounted is substantially equal to that in a state in which a filter is mounted instead of the chip capacitor. With this configuration, it is possible to achieve desired transmission characteristics in the double-band support and in the triple-band support.

According to an embodiment of the present invention, the communication apparatus of the present invention includes a high-frequency circuit unit in which a reception circuit is connected to a reception-signal output port, that is other than the reception-signal output port terminated with the capacitor, via a filter in the above high-frequency module.

In this embodiment, the double-band communication apparatus can be configured in a small size and at a low cost.

According to the embodiments of present invention, it is possible to provide a double-band high-frequency module by using a mounting board common to a triple-band high-frequency module and to reduce the size and cost of a communication apparatus using the double-band high-frequency module.

DETAILED DESCRIPTION OF PREFERRED EMBODIMENTS

Figure 2:
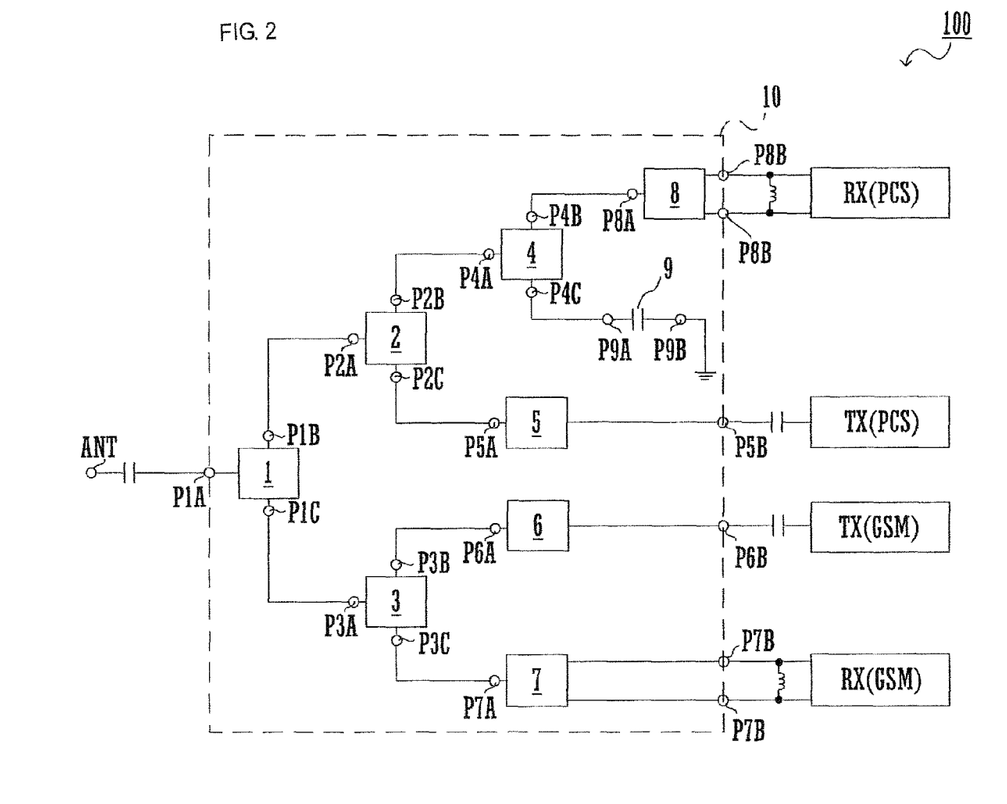
FIG. 2 is a circuit diagram of a high-frequency module according to a first embodiment.

A first embodiment of the present invention will now be described. FIG. 2 is a block diagram of a high-frequency module and a high-frequency circuit unit of a communication apparatus according to the first embodiment.

A high-frequency module 10 includes a diplexer 1, a first high-frequency switch 2, a second high-frequency switch 3, a third high-frequency switch 4, a first LC filter 5, a second LC filter 6, a SAW filter 7, a SAW filter 8, and a chip capacitor 9.

The high-frequency module 10 is a double-band module. As described below, the diplexer 1, the high-frequency switch 2, the high-frequency switch 4, the LC filter 5, the SAW filter 8, and the chip capacitor 9 compose a front end part for the PCS (1.9 GHz band). The diplexer 1, the high-frequency switch 3, the LC filter 6, and the SAW filter 7 compose a front end part for the GSM (900 MHz band).

When a mounting board (10A), on which the high-frequency module 10 is mounted, is used as the triple-band supporting board, the SAW filter 19 shown in FIG. 1 is mounted, instead of the chip capacitor 9. In this case, the diplexer 1, the high-frequency switch 2, the high-frequency switch 4, the LC filter 5, and the SAW filter 19 compose a front end part for the DCS (1.8 GHz band).

Referring to FIG. 2, in this high-frequency module 10, a first port P2A of the high-frequency switch 2 is connected to a second port P1B of the diplexer 1, and a first port P3A of the high-frequency switch 3 is connected to a third port P1C of the diplexer 1.

A first port P4A of the high-frequency switch 4 is connected to a second port P2B of the high-frequency switch 2, and a first port P5A of the LC filter 5 is connected to a third port P2C of the high-frequency switch 2.

A first port P8A (an unbalanced terminal) of the SAW filter 8 for the PCS (1.9 GHz band) is connected to a second port P4B of the high-frequency switch 4, and a first port P9A of the chip capacitor 9 is connected to a third port P4C of the high-frequency switch 4.

A first port P6A of the LC filter 6 is connected to a second port P3B of the high-frequency switch 3, and a first port P7A (an unbalanced terminal) of the SAW filter 7 for the GSM (900 MHz band) is connected to a third port P3C of the high-frequency switch 3.

The high-frequency module 10 having the above configuration uses a first port P1A of the diplexer 1, second ports P8B (balanced terminals) of the SAW filter 8, a second port P5B of the LC filter 5, a second port P6B of the LC filter 6, and second ports P7B (balanced terminals) of the SAW filter 7 as external connection terminals. A second port P9B of the chip capacitor 9 is connected to a GND terminal of the mounting board.

In order to use the high-frequency module 10 as the front end parts for the PCS and the GSM, an antenna ANT is connected to the first port P1A of the diplexer 1 via a matching capacitor. A matching reactance element is provided between the balanced terminals of the second ports P8B (balanced terminals) of the SAW filter 8, and the reception circuit RX (PCS) for the PCS is connected to the second ports P8B. The transmission circuit TX (PCS) for the PCS is connected to the second port P5B of the LC filter 5 via a matching capacitor. The transmission circuit TX (GSM) for the GSM is connected to the second port P6B of the LC filter 6 via a matching capacitor. A matching reactance element is provided between the balanced terminals of the second ports P7B (balanced terminals) of the SAW filter 7, and the reception circuit RX (GSM) for the GSM is connected to the second ports P7B. A high-frequency circuit unit 100 of a communication apparatus is configured in the above manner.

Figure 3:
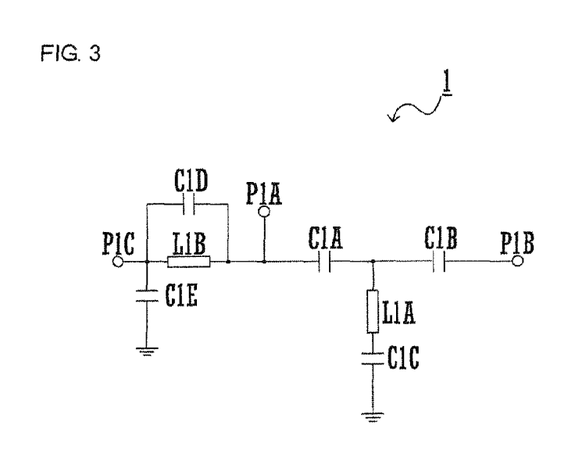
FIG. 3 is a circuit diagram of a diplexer in the high-frequency module in FIG. 2.

FIG. 3 is a circuit diagram of the diplexer 1 in the high-frequency module 10 shown in FIG. 2. The diplexer 1 includes the first port P1A, the second port P1B, the third port P1C, lines L1A and L1B, and capacitors C1A to C1E.

The capacitors C1A and C1B are connected in series between the first port P1A and the second port P1B, and the node between the capacitors C1A and C1B is grounded via the line L1A and the capacitor C1C. A parallel circuit including the line L1B and the capacitor C1D is connected between the first port P1A and the third port P1C, and the third port P1C side of the parallel circuit is grounded via the capacitor C1E.

In the above manner, a high pass filter allowing PCS (1.9 GHz band) transmission and reception signals to pass through is provided between the first port P1A and the second port P1B, and a low pass filter allowing GSM (900 MHz band) transmission and reception signals to pass through is provided between the first port P1A and the third port P1C.

Figure 4:
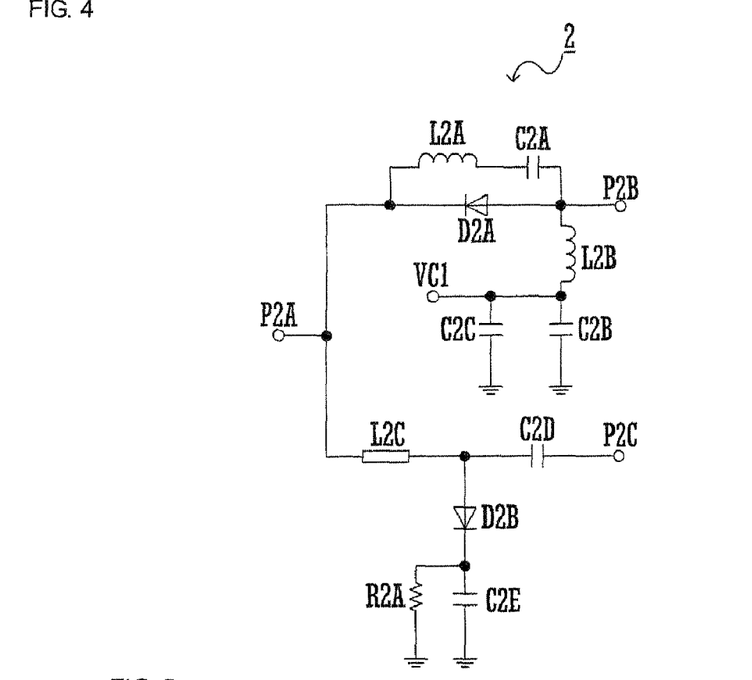
FIG. 4 is a circuit diagram of a first high-frequency switch in the high-frequency module in FIG. 2.

FIG. 4 is a circuit diagram of the high-frequency switch 2 in the high-frequency module 10 shown in FIG. 2. The high-frequency switch 2 includes the first port P2A, the second port P2B, the third port P2C, a switch control terminal VC1, diodes D2A and D2B, inductors L2A and L2B, a line L2C, capacitors C2A to C2E, and a resistor R2A.

The diode D2A is connected between the first port P2A and the second port P2B such that the cathode of the diode D2A is connected to the first port P2A. A series circuit including the inductor L2A and the capacitor C2A is connected in parallel to the diode D2A. The second port P2B side, and thus the anode, of the diode D2A are grounded via the inductor L2B, which is a choke coil, and the capacitor C2B. The switch control terminal VC1 and the capacitor C2C are connected to the node between the inductor L2B and the capacitor C2B, and the capacitor C2C is grounded.

A series circuit including the line L2C and the capacitor C2D is connected between the first port P2A and the third port P2C, the anode of the diode D2B is connected to the node between the line L2C and the capacitor C2D, and the cathode of the diode D2B is grounded via the capacitor C2E. The node between the cathode of the diode D2B and the capacitor C2E is grounded via the resistor R2A.

Figure 5:
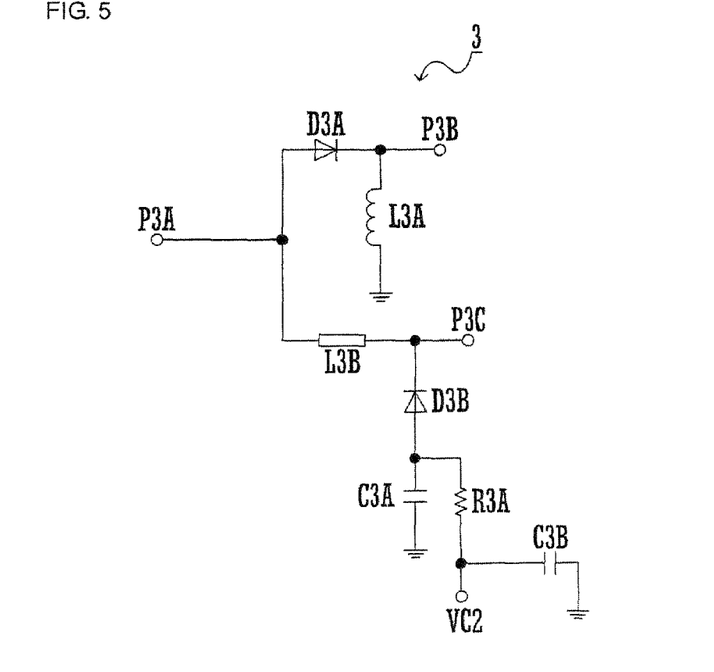
FIG. 5 is a circuit diagram of a second high-frequency switch in the high-frequency module in FIG. 2.

FIG. 5 is a circuit diagram of the high-frequency switch 3 in the high-frequency module 10 shown in FIG. 2. The high-frequency switch 3 includes the first port P3A, the second port P3B, the third port P3C, a switch control terminal VC2, diodes D3A and D3B, an inductor L3A, a line L3B, capacitors C3A and C3B, and a resistor R3A.

The diode D3A is connected between the first port P3A and the second port P3B such that the anode of the diode D3A is connected to the first port P3A. The second port P3B side, and thus the cathode, of the diode D3A are grounded via the inductor L3A, which is a choke coil.

The line L3B is connected between the first port P3A and the third port P3C, and the cathode of the diode D3B is connected to the third port P3C side of the line L3B. The anode of the diode D3B is grounded via the capacitor C3A, and the switch control terminal VC2 is connected to the node between the anode of the diode D3B and the capacitor C3A via the resistor R3A. The node between the resistor R3A and the switch control terminal VC2 is grounded via the capacitor C3B.

Figure 6:
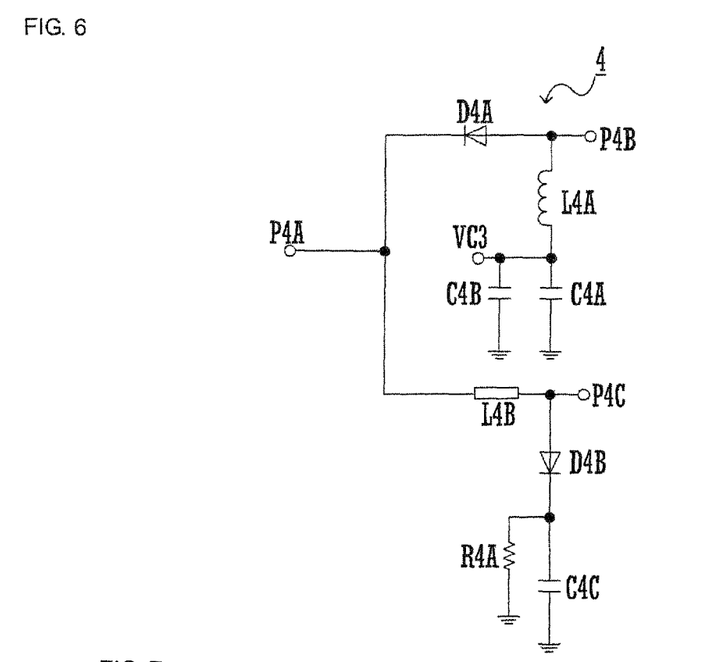
FIG. 6 is a circuit diagram of a third high-frequency switch in the high-frequency module in FIG. 2.

FIG. 6 is a circuit diagram of the high-frequency switch 4 in the high-frequency module 10 shown in FIG. 2. The high-frequency switch 4 includes the first port P4A, the second port P4B, the third port P4C, a switch control terminal VC3, an inductor L4A, a line L4B, diodes D4A and D4B, capacitors C4A to C4C, and a resistor R4A.

The diode D4A is connected between the first port P4A and the second port P4B such that the cathode of the diode D4A is connected to the first port P4A. The second port P4B side, and thus the anode, of the diode D4A are grounded via the inductor L4A, which is a choke coil, and the capacitor C4A. The switch control terminal VC3 and the capacitor C4B are connected to the node between the capacitor C4A and the inductor L4A. The capacitor C4B is grounded.

The line L4B is connected between the first port P4A and the third port P4C, and the anode of the diode D4B is connected to the third port P4C side of the line L4B. The cathode of the diode D4B is grounded via the capacitor C4C, and the node between the cathode of the diode D4B and the capacitor C4C is grounded via the resistor R4A.

Figure 7:
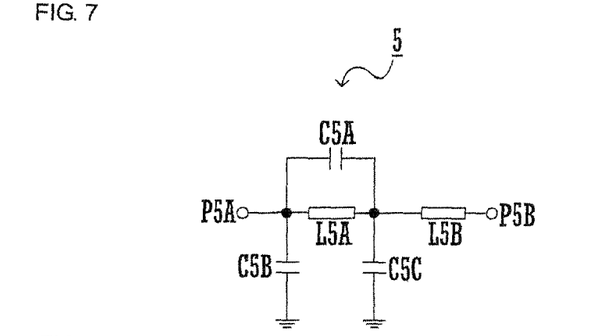
FIG. 7 is a circuit diagram of a first LC filter in the high-frequency module in FIG. 2.

FIG. 7 is a circuit diagram of the LC filter 5 in the high-frequency module 10 shown in FIG. 2. The LC filter 5 includes the first port P5A, the second port P5B, lines L5A and L5B, and capacitors C5A to C5C.

The lines L5A and L5B are connected in series between the first port P5A and the second port P5B, and the capacitor C5A is connected in parallel to the line L5A. The node between the line L5A and the line L5B is grounded via the capacitor C5C. The node between the line L5A and the first port P5A side of the capacitor C5A is grounded via the capacitor C5B.

Figure 8:
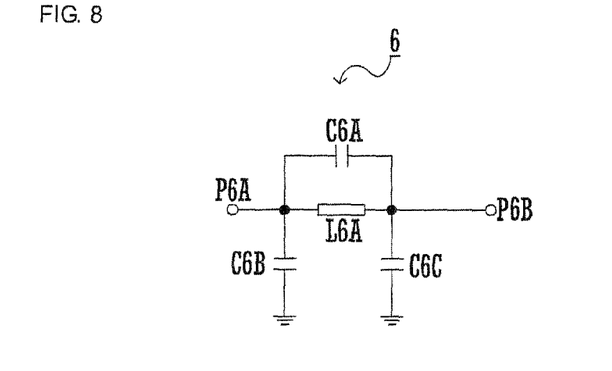
FIG. 8 is a circuit diagram of a second LC filter in the high-frequency module in FIG. 2.

FIG. 8 is a circuit diagram of the LC filter 6 in the high-frequency module 10 shown in FIG. 2. The LC filter 6 includes the first port P6A, the second port P6B, a line L6A, and capacitors C6A to C6C.

A parallel circuit including the line L6A and the capacitor C6A is connected between the first port P6A and the second port P6B, the first port P6A side of the parallel circuit including the line L6A and the capacitor C6A is grounded via the capacitor C6B, and the second port P6B side of the parallel circuit including the line L6A and the capacitor C6A is grounded via the capacitor C6C.

The high-frequency module and the high-frequency circuit unit of the communication apparatus according to the present embodiment have the configuration described above.

Figure 9:
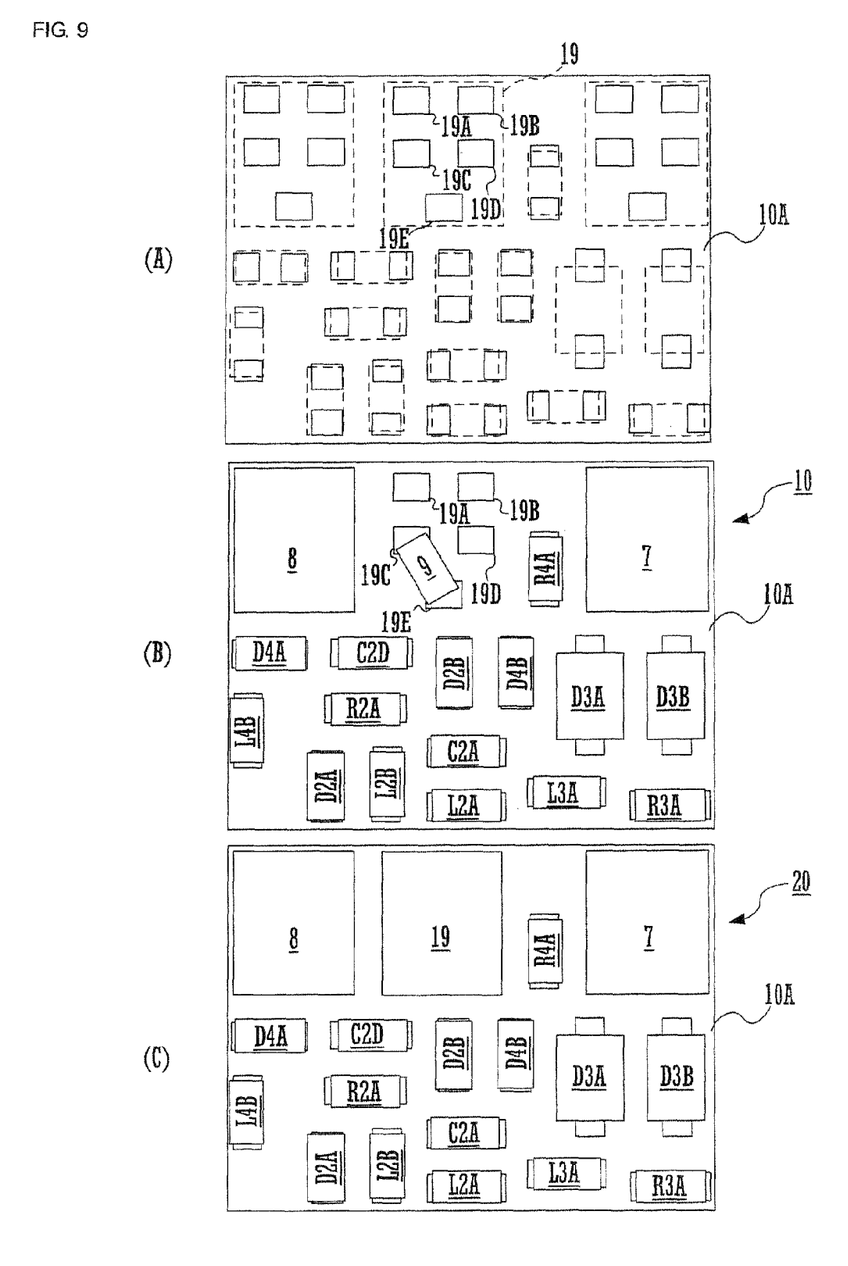
FIGS. 9(A), 9(B), and 9(C) show plan views of a mounting board of the high-frequency module in FIG. 2.

FIG. 9 includes plan views of the mounting board and the high-frequency module according to an embodiment, and of a triple-band high-frequency module sharing the mounting board with the high-frequency module according to the present embodiment.

FIG. 9(A) is a plan view of the mounting board 10A that has mounting electrodes to which parts are mounted on a layered body formed by layering dielectric layers, and that shows a state in which each chip part is not mounted. FIG. 9(B) is a plan view of the high-frequency module 10 according to the present embodiment, and which shows a state in which the chip parts are mounted on the mounting electrodes, wherein the parts are mounted on the upper surface of the mounting board 10A. FIG. 9(C) is a plan view of a triple-band high-frequency module 20 showing the state in which the chip parts are mounted on the mounting electrodes, wherein the parts are mounted on the upper surface of the mounting board 10A.

Broken lines in FIG. 9(A) indicate the positions of the chips when the chip parts shown in FIG. 9(C) are mounted. The mounting boards 10A shown in FIGS. 9(A) to 9(C) have the same configuration. The same reference numerals are used in FIGS. 9(B) and 9(C) to identify the same chip parts shown in FIGS. 1 to 8.

The double-band high-frequency module 10 according to the present embodiment will now be described with reference to FIG. 9(B). The chip capacitor C2A, the chip capacitor C2D, the chip resistor R2A, the chip inductor L2A, the chip inductor L2B, the diode D2A, and the diode D2B composing the high-frequency switch 2 are mounted on the mounting electrodes on the mounting board 10A of the high-frequency module 10. The diode D3A, the diode D3B, the chip inductor L3A, and the chip resistor R3A composing the high-frequency switch 3 are also mounted thereon. The diode D4A, the diode D4B, the chip inductor L4B, the chip resistor R4A composing the third high-frequency switch 4 are also mounted thereon. The SAW filter 7, the SAW filter 8, and the chip capacitor 9 are also mounted thereon.

In contrast, the triple-band high-frequency module 20 will now be described with reference to FIG. 9(C). The chip capacitor C2A, the chip capacitor C2D, the chip resistor R2A, the chip inductor L2A, the chip inductor L2B, the diode D2A, and the diode D2B composing the high-frequency switch 2 are mounted on the mounting electrodes on the mounting board 10A of the high-frequency module 20. The diode D3A, the diode D3B, the chip inductor L3A, and the chip resistor R3A composing the high-frequency switch 3 are also mounted thereon. The diode D4A, the diode D4B, the chip inductor L4B, and the chip resistor R4A composing the high-frequency switch 4 are also mounted thereon. The SAW filter 7, the SAW filter 8, and the SAW filter 19 are also mounted thereon.

The high-frequency module 10 according to the present embodiment differs in the configuration from the triple-band high-frequency module 20. Specifically, the high-frequency module 10 according to the present embodiment differs from the triple-band high-frequency module 20 in that the chip capacitor 9 is mounted in the high-frequency module 10 according to the present embodiment, while the SAW filter 19 is mounted in the triple-band high-frequency module 20.

The characteristics of the elements are designed (adjusted) so that the respective band characteristics necessary for the three communication systems can be achieved when the mounting board 10A and the chip parts are used in the triple-band high-frequency module 20. Mounting electrodes 19A to 19E of the SAW filter 19 are provided on the mounting board 10A, as shown in FIG. 9(A). The mounting electrodes 19A and 19B in FIG. 9(A) are signal terminals to be connected to the reception circuit RX (DCS) via the external connection terminals in the triple-band configuration. The mounting electrodes 19C and 19D are GND terminals. The mounting electrode 19E is a signal terminal to which the mounting electrode 19A of the SAW filter 19 is connected.

In order to use the mounting board 10A having the above configuration for the double-band high-frequency module according to the present embodiment, the first port P9A of the chip capacitor 9 is connected to the mounting electrode 19E, and the second port P9B of the chip capacitor 9 is connected to either of the mounting electrode 19C or 19D, which is a GND terminal. Since the first port P9A of the chip capacitor 9 and the second port P9B thereof are not actually distinguishable, the chip capacitor 9 may be oppositely connected to the mounting electrodes.

The provision of the chip capacitor 9 between the mounting electrode 19E of the mounting board 10A and the GND terminal and the termination in the above manner allow the impedance of the chip capacitor 9, viewed from the third port P4C side of the high-frequency switch 4 in FIG. 2, to be substantially equal to the impedance in the triple-band configuration.

Accordingly, the provision of the chip capacitor 9 on the triple-band mounting board 10A in the manner according to the present embodiment can configure the double-band high-frequency circuit unit 100 of the communication apparatus.

The dielectric layers used for the mounting board according to the present embodiment shown in FIG. 9 may be made of any material, such as ceramic or resin.

Next, results of an experiment conducted by the applicant will now be described.

In the experiment, comparison in the attenuation characteristics was performed between the configuration of the triple-band high-frequency module shown in FIG. 9(C), the configuration of the double-band high-frequency module resulting from removal of the SAW filter 19 from the triple-band high-frequency module, and the configuration of the double-band high-frequency module (according to the first embodiment) shown in FIG. 9(B).

Figure 10:
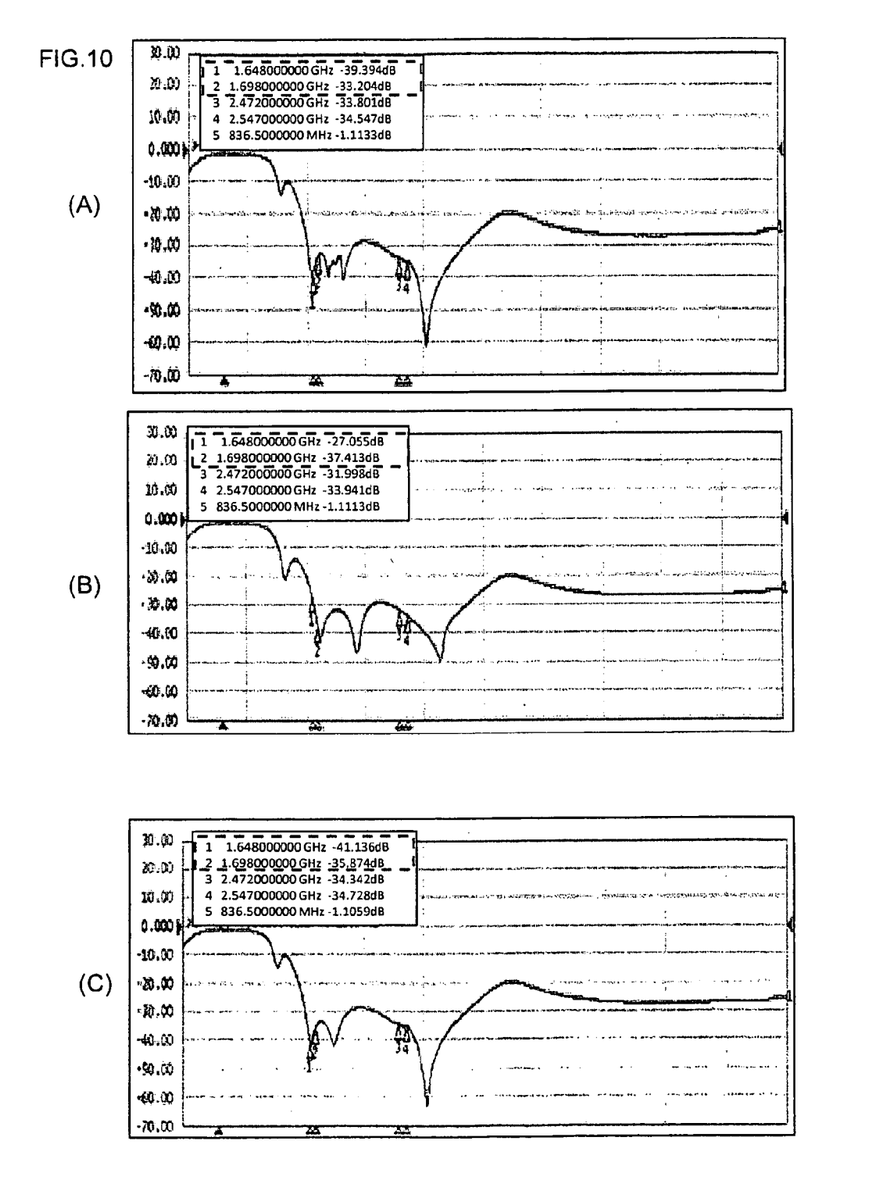
FIGS. 10(A), 10(B), and 10(C) each shows measurement results of a triple-band high-frequency module, a double-band high-frequency module with SAW filter removed, and the first embodiment of a double-band high-frequency module of the present invention, respectively.

Measurement results are shown in FIG. 10. FIG. 10(A) shows a measurement result of the triple-band high-frequency module. FIG. 10(B) shows a measurement result of the double-band high-frequency module resulting from the removal of the SAW filter 19. FIG. 10(C) shows a measurement result of the high-frequency module according to the first embodiment. The characteristics shown in FIG. 10 are transmission characteristics between the ANT terminal and the P6B terminal in the circuit shown in FIG. 2.

In the triple-band high-frequency module, the attenuation characteristics were set so as to provide about −39.4 dB at 1.648 GHz and about −33.2 dB at 1.698 GHz, as shown by a broken line in FIG. 10(A).

The high-frequency module having the configuration resulting from the removal of the SAW filter 19 from the high-frequency module having the above attenuation characteristics, as described above, had an attenuation characteristic of about −27.1 dB at 1.648 GHz and an attenuation characteristic of about −37.4 dB at 1.698 GHz, as shown by a broken line in FIG. 10(B). Specifically, compared with the triple-band high-frequency module in FIG. 10(A), the amount of attenuation decreased by about 12.3 dB at 1.648 GHz and increased by about 4.2 dB at 1.698 GHz. This is possibly caused by a shift in the attenuation pole as the result of a variation in the impedance due to the removal of the SAW filter 19. Accordingly, the characteristics are degraded when the triple-band high-frequency module is to be used as the double-band high-frequency module only by removing the SAW filter 19.

In contrast, when the chip capacitor 9 is mounted, instead of the SAW filter 19, as in the present embodiment, the high-frequency module had an attenuation characteristic of about −41.1 dB at 1.648 GHz and an attenuation characteristic of about −35.9 dB at 1.698 GHz, as shown by a broken line in FIG. 10(C). Specifically, compared with the triple-band high-frequency module in FIG. 10(A), the amount of attenuation increased by about 1.7 dB at 1.648 GHz and increased by about 2.7 dB at 1.698 GHz. This is possibly attributed to suppression of a variation in the impedance and a decrease in the shift of the attenuation pole, which are caused by mounting the chip capacitor 9 instead of the SAW filter 19. Accordingly according to the present invention, the mounting of the chip capacitor 9 allows the triple-band high-frequency module to be used as the double-band high-frequency module without degradation in the characteristics.

Figure 11:
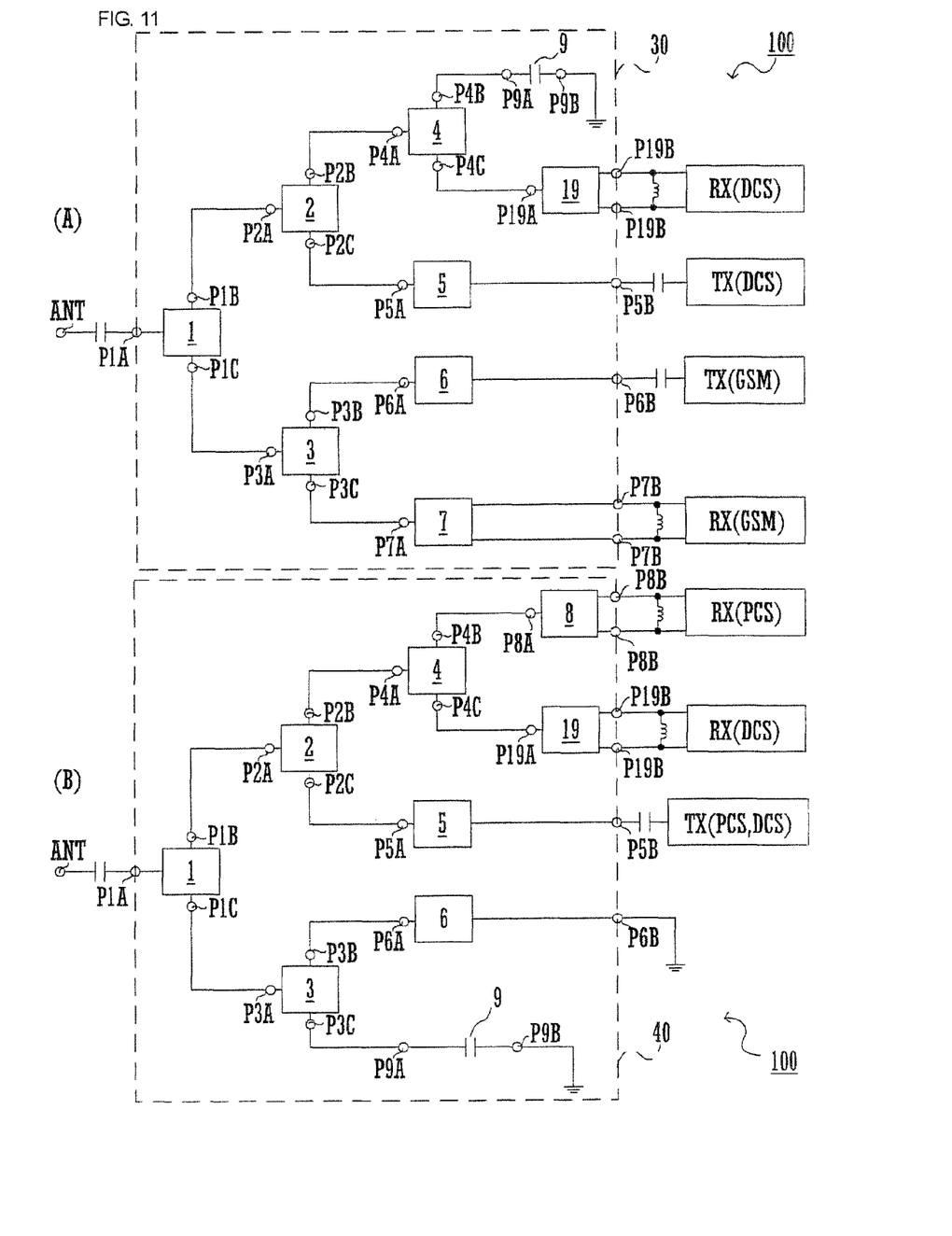
FIG. 11(A) and FIG. 11(B) each shows a circuit diagram of a second embodiment and third embodiment, respectively.

Next, a second embodiment will now be described. FIG. 11(A) is a block diagram of a high-frequency module and a high-frequency circuit unit of a communication apparatus according to the second embodiment.

A high-frequency module 30 includes the diplexer 1, the high-frequency switch 2, the high-frequency switch 3, the high-frequency switch 4, the LC filter 5, the LC filter 6, the SAW filter 7, the SAW filter 19, and the chip capacitor 9.

In the high-frequency module 30, the chip capacitor 9 is connected to the second port P4B of the high-frequency switch 4, instead of the SAW filter 8 in the high-frequency module 10 according to the first embodiment. The SAW filter 19 is connected to the third port P4C of the high-frequency switch 4, instead of the chip capacitor 9 in the high-frequency module 10 according to the first embodiment. The high-frequency switch 2, the high-frequency switch 4, the LC filter 5, the SAW filter 19, and the chip capacitor 9 compose a front end part for the DCS (1.8 GHz band). The high-frequency switch 3, the LC filter 6, and the SAW filter 7 compose a front end part for the GSM (900 MHz band).

In order to use the high-frequency module 30 having the above configuration as the front end parts for the DCS and the GSM, the antenna ANT is connected to the first port P1A of the diplexer 1 via a matching capacitor. A matching reactance element is provided between the balanced terminals of second ports P19B (balanced terminals) of the SAW filter 19, and the reception circuit RX (DCS) for the DCS is connected to the second ports P19B. The transmission circuit TX (DCS) for the DCS is connected to the second port P5B of the LC filter 5 via a matching capacitor. The transmission circuit TX (GSM) for the GSM is connected to the second port P6B of the LC filter 6 via a matching capacitor. A matching reactance element is provided between the balanced terminals of the second ports P7B (balanced terminals) of the SAW filter 7, and the reception circuit RX (GSM) for the GSM is connected to the second ports P7B. The second port P9B of the chip capacitor 9 is connected to the GND terminal of the mounting board. The high-frequency circuit unit 100 of the communication apparatus is configured in the above manner.

Next, a third embodiment will now be described. FIG. 11(B) is a block diagram of a high-frequency module and a high-frequency circuit unit of a communication apparatus according to the third embodiment.

A high-frequency module 40 includes the diplexer 1, the high-frequency switch 2, the high-frequency switch 3, the high-frequency switch 4, the LC filter 5, the LC filter 6, the SAW filter 8, the SAW filter 19, and the chip capacitor 9.

In the high-frequency module 40, the chip capacitor 9 is connected to the third port P3C of the high-frequency switch 3, instead of the SAW filter 7 in the high-frequency module 10 according to the first embodiment. The SAW filter 19 is connected to the third port P4C of the high-frequency switch 4, instead of the chip capacitor 9 in the high-frequency module 10 according to the first embodiment. The high-frequency switch 2, the high-frequency switch 4, the LC filter 5, the SAW filter 19, and the chip capacitor 9 compose a front end part for the DCS (1.8 GHz band) and the PCS (1.9 GHz band).

In order to use the high-frequency module 40 having the above configuration as the front end part for the DCS and the PCS, the antenna ANT is connected to the first port P1A of the diplexer 1 via a matching capacitor. A matching reactance element is provided between the balanced terminals of the second ports P8B (balanced terminals) of the SAW filter 8, and the reception circuit RX (PCS) for the PCS is connected to the second ports P8B. A matching reactance element is provided between the balanced terminals of the second ports P19B (balanced terminals) of the SAW filter 19, and the reception circuit RX (DCS) for the DCS is connected to the second port P19B. The transmission circuit TX (PCS, DCS) for the DCS is connected to the second port P5B of the LC filter 5 via a matching capacitor. The second port P6B of the LC filter 6 is grounded. The second port P9B of the chip capacitor 9 is connected to the GND terminal of the mounting board. The high-frequency circuit unit 100 of the communication apparatus is configured in the above manner.

As described in the above embodiments, according to the present invention, the mounting of the chip capacitor, instead of the filter module, in the triple-band high-frequency module provides the double-band high-frequency module. Similarly, it is also possible to provide a single-band high-frequency module by replacing two filter modules in the triple-band high-frequency module with chip capacitors.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A high-frequency module comprising:
a diplexer including an antenna port to be connected to an antenna, the diplexer separating the frequency bands of first and second communication systems from a frequency band of a third communication system;
a first high-frequency switch configured to separate a transmission signal of the first or second communication system from a reception signal thereof;
a second high-frequency switch configured to separate a transmission signal of the third communication system from a reception signal thereof; and
a third high-frequency switch configured to separate the reception signal of the first communication system from the reception signal of the second communication system, wherein
each of the first, second, and third communication systems include a reception-signal output port,
the diplexer and the first, second, and third high-frequency switches are integrated with one another on a layered body formed by layering a plurality of dielectric layers,
a plurality of connection electrodes are formed on the layered body,
one of the reception-signal output ports that output the respective reception signals of the first, second, and third communication systems is terminated with a chip capacitor,
one of the connection electrode of the chip capacitor has a shape allowing a filter to be mounted instead of the chip capacitor,
the one of the connection electrode is formed for mounting the chip capacitor and the filter, and
a signal at the output of the one reception-signal output port is terminated with the chip capacitor to ground such that the output port is not connected to any reception circuit.

2. The high-frequency module according to claim 1, wherein the third high-frequency switch includes a circuit connected to the reception-signal output port for the first communication system and including a switch control terminal, and a circuit connected to the reception-signal output port for the second communication system and including a connection electrode for the chip capacitor.

3. The high-frequency module according to claim 2, wherein the third high-frequency switch includes a diode and a line connected to the connection electrode of the chip capacitor, and a capacitor and a resistor connected to the diode in the circuit connected to the reception-signal output port for the second communication system, the circuit connected to the reception-signal output port for the second communication system being connected to the circuit connected to the reception-signal output port for the first communication system via the line.

4. The high-frequency module according to claim 2, wherein the filter is a surface acoustic wave filter.

5. The high-frequency module according to claim 1, wherein, when a side of the reception-signal output port for the second communication system of the third high-frequency switch is viewed from the first high-frequency switch, the impedance in a state in which the chip capacitor is mounted is substantially equal to that in a state in which a filter is mounted instead of the chip capacitor.

6. A communication apparatus, comprising:
a high-frequency circuit unit in which a reception circuit is connected to a reception-signal output port, other than a reception-signal output port terminated with a chip capacitor, of a high frequency module via a filter in the high-frequency module,
said high frequency module including
a diplexer including an antenna port to be connected to an antenna, the diplexer separating the frequency bands of first and second communication systems from a frequency band of a third communication system;
a first high-frequency switch configured to separate a transmission signal of the first or second communication system from a reception signal thereof;
a second high-frequency switch configured to separate a transmission signal of the third communication system from a reception signal thereof; and
a third high-frequency switch configured to separate the reception signal of the first communication system from the reception signal of the second communication system, wherein each of the first, second, and third communication systems include a reception-signal output port, and one of the reception-signal output ports is terminated with the chip capacitor, the diplexer and the first, second, and third high-frequency switches are integrated with one another on a layered body formed by layering a plurality of dielectric layers, a plurality of connection electrodes are formed on the layered body, one of the connection electrode of the chip capacitor has a shape allowing a filter to be mounted instead of the chip capacitor, the one of the connection electrode is formed for mounting the chip capacitor and the filter, and a signal at the output of the one reception-signal output port is terminated with the chip capacitor to ground such that the output port is not connected to any reception circuit.

7. The communication apparatus of claim 6, wherein, when a side of the reception-signal output port for the second communication system of the third high-frequency switch is viewed from the first high-frequency switch, the impedance in a state in which the chip capacitor is mounted is substantially equal to that in a state in which a filter is mounted instead of the chip capacitor.

8. The communication apparatus of claim 6, wherein the third high-frequency switch includes a circuit connected to the reception-signal output port for the first communication system and including a switch control terminal, and a circuit connected to the reception-signal output port for the second communication system and including a connection electrode for the chip capacitor.

9. The communication apparatus of claim 8, wherein the third high-frequency switch includes a diode and a line connected to the connection electrode of the chip capacitor, and a capacitor and a resistor connected to the diode in the circuit connected to the reception-signal output port for the second communication system, the circuit connected to the reception-signal output port for the second communication system being connected to the circuit connected to the reception-signal output port for the first communication system via the line.

* * * * *